(12) United States Patent
Blaum et al.

(10) Patent No.: US 11,038,533 B2
(45) Date of Patent: Jun. 15, 2021

(54) EXPANSION FOR GENERALIZED EVENODD CODES

(71) Applicant: International Business Machines Corporation, Armonk, NY (US)

(72) Inventors: Mario Blaum, San Jose, CA (US); Steven R. Hetzler, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 16/395,065

(22) Filed: Apr. 25, 2019

(65) Prior Publication Data
US 2020/0343914 A1 Oct. 29, 2020

(51) Int. Cl.
*H03M 13/15* (2006.01)
*H03M 13/37* (2006.01)

(52) U.S. Cl.
CPC ..... *H03M 13/1575* (2013.01); *H03M 13/373* (2013.01); *H03M 13/3753* (2013.01)

(58) Field of Classification Search
None
See application file for complete search history.

(56) References Cited

U.S. PATENT DOCUMENTS

| | | | |
|---|---|---|---|
| 7,321,905 B2 | 1/2008 | Hartline et al. | |
| 7,904,782 B2 | 3/2011 | Huang et al. | |
| 7,945,729 B2 | 5/2011 | Hafner | |
| 8,433,979 B2 | 4/2013 | Blaum et al. | |
| 8,869,006 B2 | 10/2014 | Blaum et al. | |
| 9,037,951 B2* | 5/2015 | Cideciyan | G06F 11/1012 714/773 |
| 9,252,815 B2 | 2/2016 | Blaum et al. | |
| 9,454,333 B2 | 9/2016 | Blaum et al. | |
| 9,870,284 B2 | 1/2018 | Blaum et al. | |
| 10,019,192 B2 | 7/2018 | Bakre et al. | |
| 10,025,512 B2 | 7/2018 | Wang et al. | |
| 10,031,701 B2 | 7/2018 | Best et al. | |
| 10,430,123 B2* | 10/2019 | Best | G06F 11/1076 |
| 2006/0074995 A1 | 4/2006 | Hafner et al. | |
| 2006/0129873 A1 | 6/2006 | Hafner | |
| 2016/0254826 A1 | 9/2016 | David et al. | |

(Continued)

FOREIGN PATENT DOCUMENTS

| | | |
|---|---|---|
| CN | 104850468 B | 4/2018 |
| CN | 108228382 A | 6/2018 |

(Continued)

OTHER PUBLICATIONS

Hou et al., "On the MDS Condition of Blaum-Bruck-Vardy Codes With Large Number Parity Columns," IEEE Communications Letters, vol. 20, No. 4, Apr. 2016, pp. 644-647.

(Continued)

*Primary Examiner* — Phung M Chung
(74) *Attorney, Agent, or Firm* — Zilka-Kotab, P.C.

(57) ABSTRACT

A computer-implemented method includes encoding an array of $(p-1) \times k$ symbols of data into a $p \times (k+r)$ array. The method includes p is a prime number, $r \geq 1$, and $k \leq p$. The method includes each column in the $p \times (k+r)$ array has an even parity and symbol i in column r+j, for $0 \leq i \leq p-1$ and $0 \leq j \leq r-1$, is the XOR of symbols in a line of slope j taken with a toroidal topology modulo p in the k columns starting in symbol i of column 0.

25 Claims, 7 Drawing Sheets

1100

| $p$ | $k$ | Enhanced Encoding Algorithm for EER(p, k, 2) $(3p-1)k - 2$ | Encoding Algorithm for EIP(p, k, r) $3kp - 2(k+p)$ | Improvement % |
|---|---|---|---|---|
| 17 | 8 | 398 | 358 | 10.1% |
| 17 | 15 | 748 | 701 | 6.3% |
| 127 | 8 | 3038 | 2778 | 8.6% |
| 127 | 50 | 18998 | 18696 | 1.6% |
| 127 | 125 | 47498 | 47121 | .8% |
| 257 | 8 | 6158 | 5638 | 8.4% |
| 257 | 50 | 38498 | 37936 | 1.5% |
| 257 | 255 | 196348 | 195581 | .4% |

(56) References Cited

U.S. PATENT DOCUMENTS

2016/0274972 A1    9/2016   Li et al.
2016/0380650 A1   12/2016   Calder et al.

FOREIGN PATENT DOCUMENTS

WO      2013078342 A1    5/2013
WO      2018171111 A1    9/2018

OTHER PUBLICATIONS

Li, P., "Enabling Low Degraded Read Latency and Fast Recovery for Erasure Coded Cloud Storage Systems," 47th Annual IEEE/IFIP International Conference on Dependable Systems and Networks Workshops, 2017, pp. 164-167.

Huang et al., "STAR: An Efficient Coding Scheme for Correcting Triple Storage Node Failures," IEEE Transactions on Computers, vol. 57, No. 7, Jul. 2008, pp. 889-901.

Blaum et al., U.S. Appl. No. 16/262,599, filed Jan. 30, 2019.

Tamo et al., "Optimal Locally Repairable Codes and Connections to Matroid Theory," IEEE Transactions on Information Theory, vol. 62, No. 12, Dec. 2016, pp. 6661-6671.

Blaum et al., "Extended Product and Integrated Interleaved Codes," IEEE Transactions on Information Theory, vol. 54, No. 3, Mar. 2018, pp. 1497-1513.

Blaum et al., "New Array Codes for Multiple Phased Burst Correction," IEEE Transactions on Information Theory, vol. 39, No. 1, Jan. 1993, pp. 66-77.

Guo et al., "On Systematic Encoding for Blaum-Roth Codes," IEEE International Symposium on Information Theory Proceedings, 2011, pp. 2353-2357.

Wikipedia, "Parity bit," Wikipedia, 2018, 5 pages, retrieved from https://en.wikipedia.org/wiki/Parity_bit.

Blaum et al., "EVENODD: An Efficient Scheme for Tolerating Double Disk Failures in RAID Architectures," IEEE Transactions on Computers, vol. 44, No. 2, Feb. 1995, pp. 192-202.

Blaum et al., "The EVENODD Code and its Generalization: An Efficient Scheme for Tolerating Multiple Disk Failures in RAID Architectures," High Performance Mass Storage and Parallel I/O: Technologies and Applications, Chapter 8, 2002, pp. 93-117.

Hou et al., "BASIC Codes: Low-Complexity Regenerating Codes for Distributed Storage Systems," IEEE Transactions on Information Theory, vol. 62, No. 6, Jun. 2016, pp. 3053-3069.

Tamo et al., "Bounds on Locally Recoverable Codes with Multiple Recovering Sets," IEEE International Symposium on Information Theory, 2014, pp. 691-695.

Gopalan et al., "Explicit Maximally Recoverable Codes With Locality," IEEE Transactions on Information Theory, vol. 60, No. 9, Sep. 2014, pp. 5245-5256.

Blaum, M., "A Family of MDS Array Codes with Minimal Number of Encoding Operations," IEEE International Symposium on Information Theory, Jul. 2006, pp. 2784-2788.

Gopalan et al., "On the Locality of Codeword Symbols," IEEE Transactions on Information Theory, vol. 58, No. 11, Nov. 2012, pp. 6925-6934.

Gopalan et al., "Maximally Recoverable Codes for Grid-like Topologies," arXiv print, 2016, 23 pages, retrieved from https://arxiv.org/abs/1605.05412v1.

Tamo et al., "A Family of Optimal Locally Recoverable Codes," IEEE Transactions on Information Theory, vol. 60, No. 8, Aug. 2014, pp. 4661-4676.

Corbett et al., "Row-Diagonal Parity for Double Disk Failure Correction," Proceedings of the Third USENIX Conference on File and Storage Technologies, 2004, 15 pages.

Shum et al., "Regenerating Codes over a Binary Cyclic Code," IEEE International Symposium on Information Theory, 2014, pp. 1046-1050.

Hou et al., "A Unified Form of EVENODD and RDP Codes and Their Efficient Decoding," arXiv draft, IEEE Transactions on Communications, Mar. 12, 2018, pp. 1-30, retrieved from https://arxiv.org/pdf/1803.03508.pdf.

Zeh et al., "Bounds and Constructions of Codes with Multiple Localities," IEEE International Symposium on Information Theory, 2016, pp. 640-644.

Blaum et al., "MDS Array Codes with Independent Parity Symbols," IEEE Transactions on Information Theory, vol. 42, No. 2, Mar. 1996, pp. 529-542.

Fujita, H., "Modi?ed Low-Density MDS Array Codes," IEEE International Symposium on Information Theory (ISIT'06), Jul. 2006, pp. 2789-2793.

MacWilliams et al., "The Theory of Error-Correcting Codes," North-Holland Mathematical Library, vol. 16, 1981, 771 pages.

Blaum et al., U.S. Appl. No. 16/371,933, filed Apr. 1, 2019.

Rashmi et al., "A 'Hitchhiker's' Guide to Fast and Efficient Data Reconstruction in Erasure-coded Data Centers," SIGCOMM'14, Aug. 17-22, 2014, pp. 1-12.

Hately, A., "IBM Cloud announces network expansion with availability zones in six global regions," IBM, Jun. 10, 2018, 7 pages, retrieved from https://www.ibm.com/blogs/bluemix/2018/06/expansion-availability-zones-global-regions/.

Anonymous, "NIST Cloud Computing Program," NIST, Information Technology Laboratory, Nov. 13, 2013, pp. 1-2, retrieved from www.nist.gov/itl/cloud/.

Mell et al., "The NIST Definition of Cloud Computing," Version 15, Dec. 7, 2009, pp. 1-2.

Mell et al., "The NIST Definition of Cloud Computing," Recommendations of the National Institute of Standards and Technology, NIST Special Publication 800-145, Sep. 2011, pp. 1-7.

CSRC, "Cloud Computing," Computer Security Resource Center, Oct. 2017, 3 pages, retrieved from https://csrc.nist.gov/projects/cloud-computing.

Fujita, H., "Modifed Low-Density MDS Array Codes," IEEE International Symposium on Information Theory (ISIT'06), Jul. 2006, pp. 2789-2793.

* cited by examiner

FIG. 4

| 1 | 0 | 0 | 0 | 1 |
|---|---|---|---|---|
| 1 | 1 | 1 | 0 | 1 |
| 0 | 1 | 0 | 0 | 1 |
| 0 | 1 | 0 | 0 | 1 |
| 0 | 0 | 0 | 0 | 0 |

FIG. 5

| 1 | 0 | 0 | 1 | 1 |   |   |
|---|---|---|---|---|---|---|
| 0 | 1 | 0 | 1 | 1 |   |   |
| 0 | 0 | 0 | 0 | 1 |   |   |
| 1 | 1 | 0 | 1 | 1 |   |   |
|   |   |   |   |   |   |   |

FIG. 8

| 1 | 0 | 0 | 1 | 1 |   |   |
|---|---|---|---|---|---|---|
| 0 | 1 | 0 | 1 | 1 |   |   |
| 0 | 0 | 0 | 0 | 1 |   |   |
| 1 | 1 | 0 | 1 | 1 |   |   |
| 0 | 0 | 0 | 1 | 0 |   |   |

FIG. 9

| 1 | 0 | 0 | 1 | 1 | 1 | 0 | 0 |
|---|---|---|---|---|---|---|---|
| 0 | 1 | 0 | 1 | 1 | 1 | 0 | 0 |
| 0 | 0 | 0 | 0 | 1 | 1 | 1 | 1 |
| 1 | 1 | 0 | 1 | 1 | 0 | 0 | 1 |
| 0 | 0 | 0 | 1 | 0 | 1 | 1 | 0 |

FIG. 10

| $p$ | $k$ | Enhanced Encoding Algorithm for $EBR(p, k, 2)$ $(3p-1)k-2$ | Encoding Algorithm for $EIP(p, k, l)$ $3kp-2(k+p)$ | Improvement % |
|---|---|---|---|---|
| 17 | 8 | 398 | 358 | 10.1% |
| 17 | 15 | 748 | 701 | 6.3% |
| 127 | 8 | 3038 | 2778 | 8.6% |
| 127 | 50 | 18998 | 18696 | 1.6% |
| 127 | 125 | 47498 | 47121 | .8% |
| 257 | 8 | 6158 | 5638 | 8.4% |
| 257 | 50 | 38498 | 37936 | 1.5% |
| 257 | 255 | 196,348 | 195581 | .4% |

FIG. 11

EXPANSION FOR GENERALIZED EVENODD CODES

BACKGROUND

The present invention relates to erasure correcting codes, and more specifically, this invention relates to an expansion for generalized EVENODD codes.

Reliable delivery of data is an essential aspect of data storage systems. Error detection and correction schemes are used to detect errors in data delivery and reconstruct data when an error is detected. Error detection and correction schemes are especially important for delivery of data over unreliable communication channels and/or channels which are subject to noise. Data redundancy schemes, such as parity computation, enable reliable delivery of data using error detection and correction techniques by adding redundancy and/or extra data to a message. Redundancy and/or extra data may be used to check the message for consistency with the original message.

Classic Blaum-Roth (BR) codes with r parity columns include $(p-1)\times(k+r)$ (binary) arrays, where p is a prime number and $k \leq p-r$. Each line of slope i, $0 \leq i \leq r-1$, has even parity when the lines are taken toroidally. BR codes are a family of array codes over GF(q) for correcting multiple phased burst errors and erasures. Each phased burst may correspond to an erroneous and/or erased column in a code array. An array is said to be erroneous if at least one of the bits in a column is inverted. If the index of an erroneous column is known, the column is subject to an erasure.

BR codes are characterized geometrically by parity constraints along certain diagonal lines in each code array. BR codes have an efficient decoding algorithm which avoids multiplications and/or divisions over extension fields. BR codes replace these operations with cyclic shifts of vectors over GF(q).

EVENODD array codes use parities along multiple lines and provide independent parities to minimize the number of updates in the parity when a data symbol is updated. Each storage node may be logically arranged as a single column. The columns of data may be $k = p$, where p is a prime number. EVENODD codes use XOR operations for encoding and decoding in order to reduce processing time and expense as compared to finite field operations.

Error detection and/or correction codes are limited in the number of bits the codes may detect and/or correct in the data stream. Often, there are significant costs associated with error detection and/or correction schemes, especially for error detection and/or correction schemes which provide relatively more bit detection and/or correction abilities.

SUMMARY

A computer-implemented method, according to one approach, includes encoding an array of $(p-1)\times k$ symbols of data into a $p\times(k+r)$ array. The method includes p is a prime number, $r \geq 1$, and $k \leq p$. The method includes each column in the $p\times(k+r)$ array has an even parity and symbol i in column $r+j$, for $0 \leq i \leq p-1$ and $0 \leq j \leq r-1$, is the XOR of symbols in a line of slope j taken with a toroidal topology modulo p in the k columns starting in symbol i of column 0. The method provides the benefit expanding generalized independent parity codes and optimizes the number of XOR operations for encoding data.

The method may optionally include $r=2$. The method provides the benefit of optimizing the number of XOR operations for encoding data, especially when $k \ll p$.

The method may optionally include decoding the $p\times(k+2)$ array. Decoding the $p\times(k+2)$ array includes recovering erasure patterns by iteratively recovering up to one erased symbol in each column and recovering up to one erased symbol in each set of k+1 symbols. The method also includes setting erased columns i and j, for $0 \leq i < j \leq k-1$, to zero. The method includes computing a syndrome vector $S_0$ as the XOR of the k data columns with the first parity column and computing a syndrome vector $S_1$ as the XOR of the first data column, the second data column rotated once, the third data column rotated twice, continuing up to the kth data column rotated k-1 times with the second parity column. The method also includes computing a vector V as the XOR of the syndrome vector $S_0$ with the syndrome vector $S_1$ rotated p-i times and computing an erased column $C_j$ as the solution of a recursion $(1 \oplus \alpha^{j-i})C_j = V$. According to the method, $(1 \oplus \alpha^{j-i})C_j$ denotes the XOR of vector $C_j$ rotated j-i times. The method includes computing an erased column $C_i$ as the XOR of vectors $C_j$ and $S_0$ and outputting the decoded $p\times(k+2)$ array. The method provides the benefit of optimizing the number of XOR operations which are inexpensive and faster to process than finite field operations.

A computer-program product for expanding generalized EVENODD codes, according to another approach, includes a computer readable storage medium having program instructions. The program instructions are executable by a computer. The program instructions cause the computer to perform the foregoing method.

A system, according to another approach, includes a processor and logic integrated with the processor, executable by the processor, or integrated with and executable by the processor. The logic is configured to perform the foregoing method.

Other aspects and configurations of the present invention will become apparent from the following detailed description, which, when taken in conjunction with the drawings, illustrate by way of example the principles of the invention.

BRIEF DESCRIPTION OF THE DRAWINGS

FIG. 4 is an exemplary array for p=5, k=2 and r=3, according to one approach.

FIG. 5 is an exemplary 4×5 array in a BR code, according to one approach.

FIG. 8 is a 4×5 array to be encoded, according to one approach.

FIG. 9 is the result of computing the vertical parities of data by XORing the bits in each column of FIG. 8, according to one approach.

FIG. 10 is the final encoded array of FIG. 8 using the disclosed method, according to one approach.

FIG. 11 is a table comparing the number of XOR operations used for the optimized encoding algorithm for EBR(p, k, 2) and the encoding algorithm for EIP(p, k, r), according to one approach.

DETAILED DESCRIPTION

Figure 1:
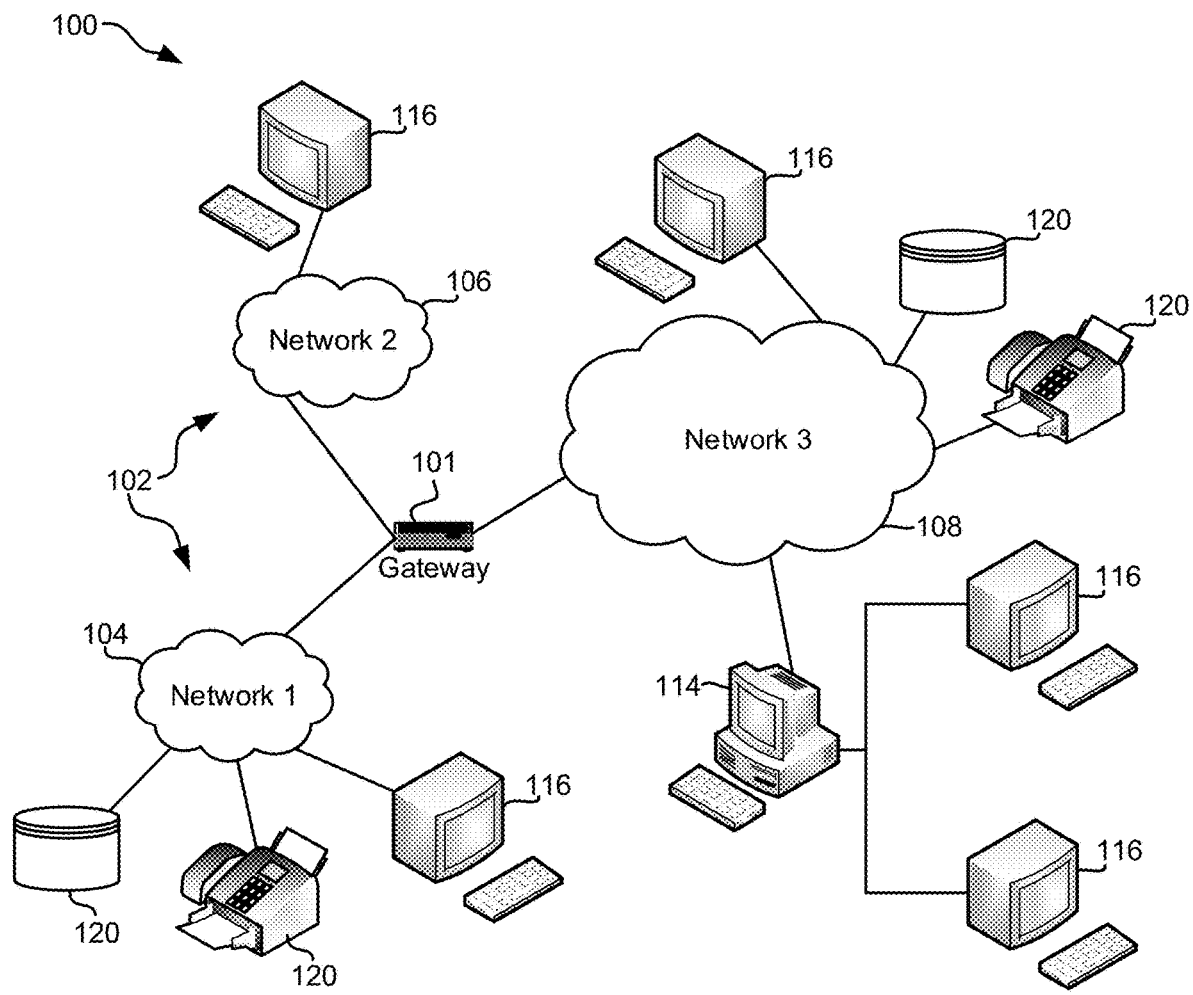
FIG. 1 illustrates a network architecture, in accordance with one configuration.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred configurations of systems, methods and computer program products for an expansion for generalized EVENODD codes.

In one general approach, a computer-implemented method includes encoding an array of (p−1)×k symbols of data into a p×(k+r) array. The method includes p is a prime number, r≥1, and k≤p. The method includes each column in the p×(k+r) array has an even parity and symbol i in column r+j, for 0≤i≤p−1 and 0≤j≤r−1, is the XOR of symbols in a line of slope j taken with a toroidal topology modulo p in the k columns starting in symbol i of column 0. The method provides the benefit expanding generalized independent parity codes and optimizes the number of XOR operations for encoding data.

In an optional approach, method may include r=2. The method provides the benefit of optimizing the number of XOR operations, especially when k≪p.

In yet another optional approach, include decoding the p×(k+2) array. Decoding the p×(k+2) array includes recovering erasure patterns by iteratively recovering up to one erased symbol in each column and recovering up to one erased symbol in each set of k+1 symbols. The method also includes setting erased columns i and j, for 0≤i<j≤k−1, to zero. The method includes computing a syndrome vector $S_0$ as the XOR of the k data columns with the first parity column and computing a syndrome vector $S_1$ as the XOR of the first data column, the second data column rotated once, the third data column rotated twice, continuing up to the kth data column rotated k−1 times with the second parity column. The method also includes computing a vector V as the XOR of the syndrome vector $S_0$ with the syndrome vector $S_1$ rotated p−i times and computing an erased column $C_j$ as the solution of a recursion $(1 \oplus \alpha^{j-i})C_j=V$. According to the method, $(1 \oplus \alpha^{j-i})C_j$ denotes the XOR of vector $C_j$ rotated j−i times. The method includes computing an erased column $C_i$ as the XOR of vectors $C_1$ and $S_0$ and outputting the decoded p×(k+2) array. The method provides the benefit of optimizing the number of XOR operations which are inexpensive and faster to process than finite field operations.

In another general approach, a computer-program product for expanding generalized EVENODD codes includes a computer readable storage medium having program instructions. The program instructions are executable by a computer. The program instructions cause the computer to perform the foregoing method.

In another general approach, a system includes a processor and logic integrated with the processor, executable by the processor, or integrated with and executable by the processor. The logic is configured to perform the foregoing method.

FIG. 1 illustrates an architecture 100, in accordance with one approach. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a local area network (LAN), a wide area network (WAN) such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 116 may also be directly coupled to any of the networks, in one approach.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some configurations.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
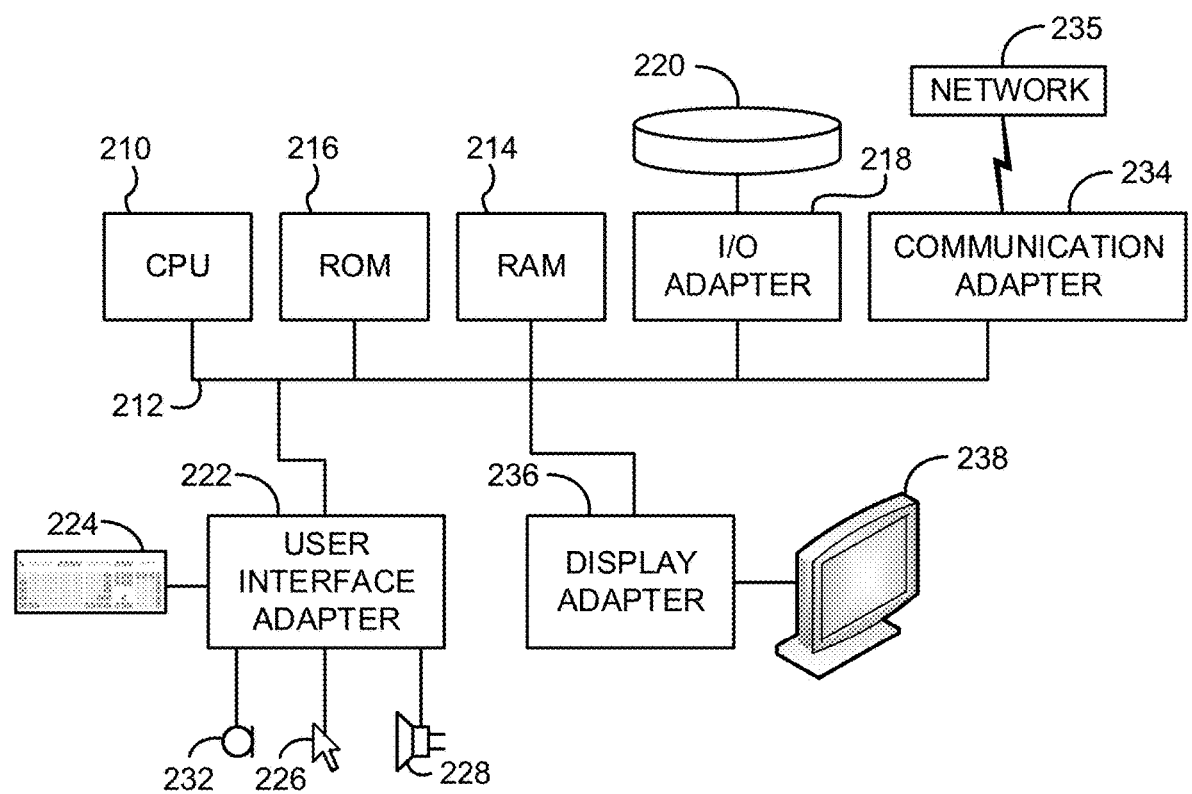
FIG. 2 shows a representative hardware environment that may be associated with the servers and/or clients of FIG. 1, in accordance with one approach.

FIG. 2 shows a representative hardware environment associated with a user device 116 and/or server 114 of FIG. 1, in accordance with one approach. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an input/output (I/O) adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred approach may also be implemented on platforms and operating systems other than those mentioned. A preferred approach may be written using eXtensible Markup Language (XML), C, and/or C++ language, or other programming languages, along with an object oriented programming methodology. Object oriented programming (OOP), which has become increasingly used to develop complex applications, may be used.

Figure 3:
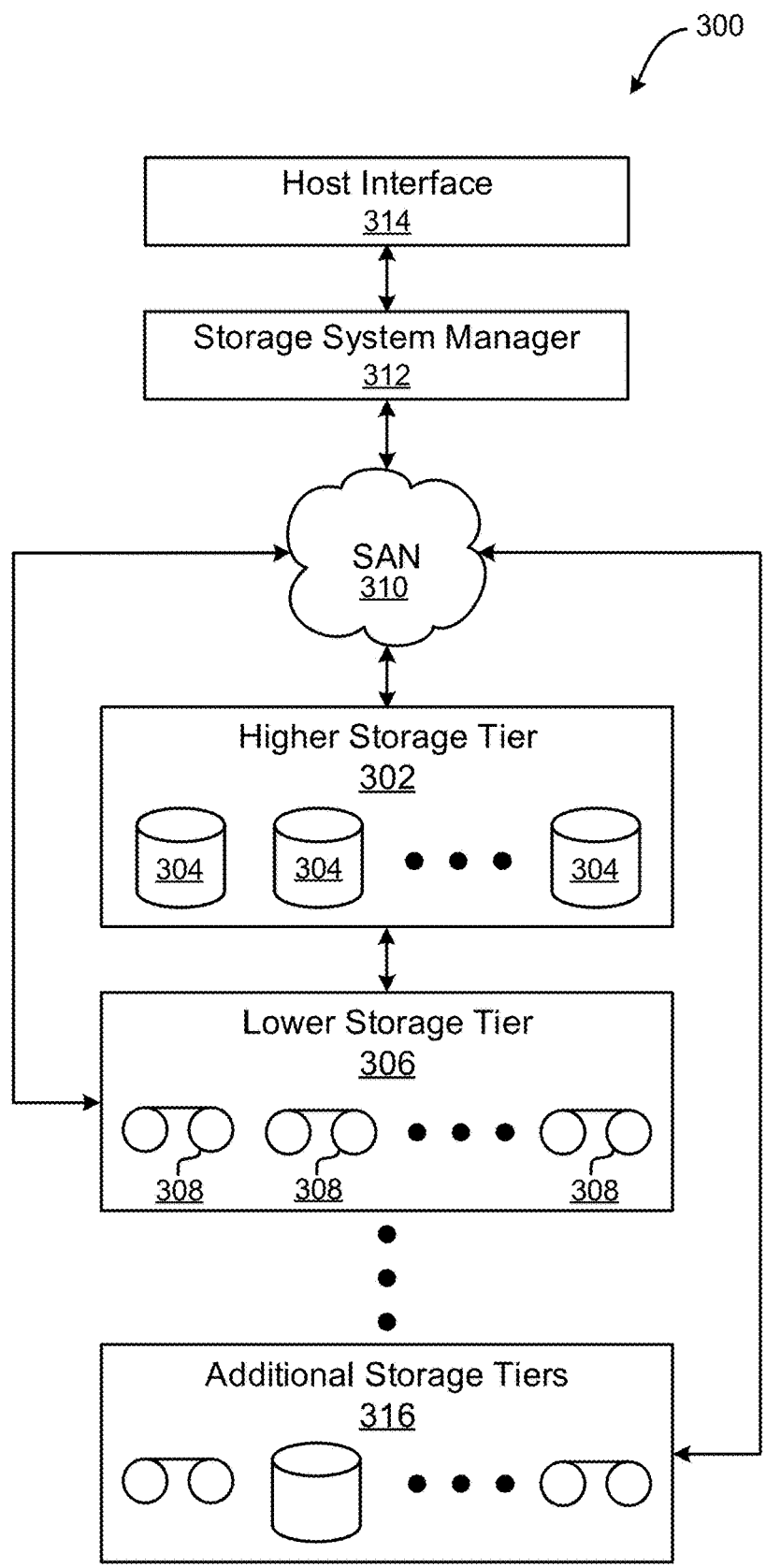
FIG. 3 illustrates a tiered data storage system in accordance with one approach.

Now referring to FIG. 3, a storage system 300 is shown according to one approach. Note that some of the elements shown in FIG. 3 may be implemented as hardware and/or software, according to various configurations. The storage system 300 may include a storage system manager 312 for communicating with a plurality of media and/or drives on at least one higher storage tier 302 and at least one lower storage tier 306. The higher storage tier(s) 302 preferably may include one or more random access and/or direct access media 304, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 306 may preferably include one or more lower performing storage media 308, including sequential access media such as magnetic tape in tape drives and/or optical media, slower accessing HDDs, slower accessing SSDs, etc., and/or others noted herein or known in the art. One or more additional storage tiers 316 may include any combination of storage memory media as desired by a designer of the system 300. Also, any of the higher storage tiers 302 and/or the lower storage tiers 306 may include some combination of storage devices and/or storage media.

The storage system manager 312 may communicate with the drives and/or storage media 304, 308 on the higher storage tier(s) 302 and lower storage tier(s) 306 through a network 310, such as a storage area network (SAN), as shown in FIG. 3, or some other suitable network type. The storage system manager 312 may also communicate with one or more host systems (not shown) through a host interface 314, which may or may not be a part of the storage system manager 312. The storage system manager 312 and/or any other component of the storage system 300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more configurations, the storage system 300 may include any number of data storage tiers, and may include the same or different storage memory media within each storage tier. For example, each data storage tier may include the same type of storage memory media, such as HDDs, SSDs, sequential access media (tape in tape drives, optical disc in optical disc drives, etc.), direct access media (CD-ROM, DVD-ROM, etc.), or any combination of media storage types. In one such configuration, a higher storage tier 302, may include a majority of SSD storage media for storing data in a higher performing storage environment, and remaining storage tiers, including lower storage tier 306 and additional storage tiers 316 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 302, while data not having one of these attributes may be stored to the additional storage tiers 316, including lower storage tier 306. Of course, one of skill in the art, upon reading the present descriptions, may devise many other combinations of storage media types to implement into different storage schemes, according to the configurations presented herein.

According to some configurations, the storage system (such as 300) may include logic configured to receive a request to open a data set, logic configured to determine if the requested data set is stored to a lower storage tier 306 of a tiered data storage system 300 in multiple associated portions, logic configured to move each associated portion of the requested data set to a higher storage tier 302 of the tiered data storage system 300, and logic configured to assemble the requested data set on the higher storage tier 302 of the tiered data storage system 300 from the associated portions.

Of course, this logic may be implemented as a method on any device and/or system or as a computer program product, according to various configurations.

Error detection and/or correction codes are limited in the number of bits the codes may detect and/or correct in the data stream. Often, there are significant costs associated with error detection and/or correction schemes, especially for error detection and/or correction schemes which provide relatively more bit detection and/or correction abilities.

In various configurations, array codes may be used in the cloud. In some approaches, each entry may correspond to a whole device. In some applications, each column represents a device and each entry represents a sector and/or a page in a device. Erasure codes involving local and global parities may be invoked.

An array code with vertical parity may provide the benefit of parity within a device. Expanded Independent Parity (EIP) codes may use only XOR operations which are inexpensive and relatively faster to process than codes which use finite field operations. EIP codes may be implemented into software defined storage systems.

In various configurations, EIP code arrays comprise p information columns and r independent parity columns where r≥1. Each column may comprise p bits where p is a prime number. The array may comprise k rows where k≤p. The array may comprise any p value (e.g., prime value) provided the r parity columns remain independent of each other. It should be understood by one having ordinary skill in the art upon reading the present disclosure that any information columns, rows, parity columns, etc. as referred to herein may be logically arranged as such columns, rows, etc.

In one approach, classic BR codes with r parity columns comprise (p−1)×(k+r) (binary) arrays, where p is a prime number and k≤p−r. Each line of slope i, 0≤i≤r−1, has even parity when the lines are taken toroidally. Even parity comprises, for a given set of bits, the occurrence of bits whose value is 1 is counted. If the occurrence of bits is odd, the parity bit value is set to 1, making the total count of occurrences of is in the whole set an even number. If the count of is is even, the parity bit value is set to 0.

Various approaches, examples, and/or lemmas as disclosed herein may be implemented in conjunction with features from any other approach, example, and/or lemma listed herein, such as those described with reference to other FIGS. Of course, however, such approaches, examples, and/or lemmas presented herein may be used in various applications and/or permutations which may or may not be specifically described in the illustrative configurations listed herein. Further, the various approaches, examples, and/or lemmas presented herein may be used in any desired environment.

Figures 4, 5:
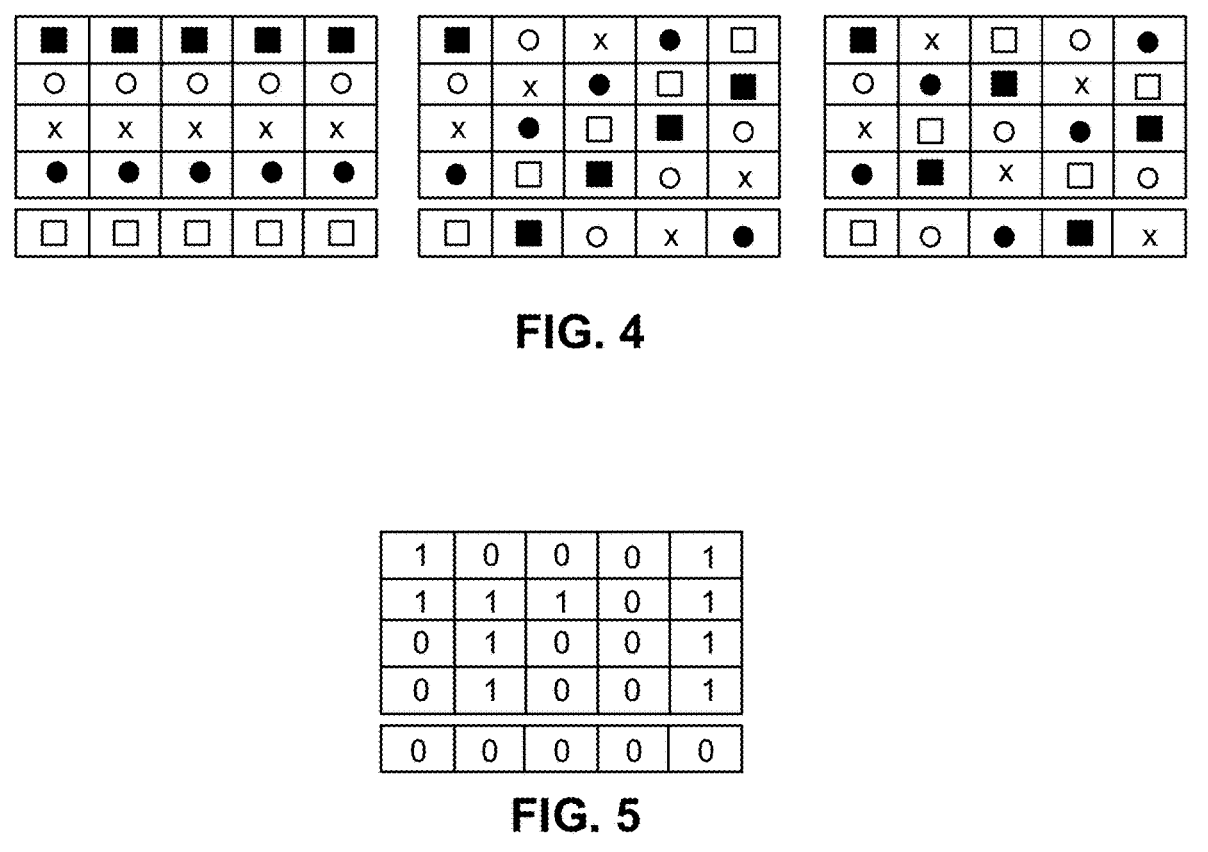

FIG. 4 is an exemplary array for p=5, k=2 and r=3. The lines shown are of slope 0 (e.g., the horizontal lines), slope 1, and slope 2 respectively. A fifth row of imaginary "zeros" is added to facilitate this description. Each of the lines has an even parity (e.g., an even number of ones) in classic BR codes.

FIG. 5 is an exemplary 4×5 array in a BR code. Each line of slope 0, slope 1, and slope 2 has an even parity. It should be noted that the last row of zeros is an imaginary row which is not written.

In one approach, an equivalent description of BR codes may include the following algebraic formulation. Consider a ring of polynomials modulo $M_p(x)=1+x+x^2+\ldots+x^{p-1}$. Each column in the array may be considered an element in the polynomial ring in at least some approaches. Let $M_p(\alpha)=0$. A parity check matrix of a [k+r, k] BR code with k≤p−r is given by the Reed-Solomon (RS) type matrix:

$$H_{p,k,r} = \begin{pmatrix} 1 & 1 & 1 & \ldots & 1 \\ 1 & \alpha & \alpha^2 & \ldots & \alpha^{k+r-1} \\ 1 & \alpha^2 & \alpha^4 & \ldots & \alpha^{2(k+r-1)} \\ \vdots & \vdots & \vdots & \ddots & \vdots \\ 1 & \alpha^{r-1} & \alpha^{2(r-1)} & \ldots & \alpha^{(r-1)(k+r-1)} \end{pmatrix} \quad (1)$$

A [k+r, k] BR code is a maximum distance separable (MDS) code over the ring of polynomials modulo $M_p(x)$ (e.g., any r erased columns in an array in the BR code may be recovered). BR codes may be expanded by adding an additional vertical parity to the r parities of slope i for 0≤i≤r−1 (e.g., Expanded Blaum-Roth (EBR) codes).

BR codes and other array codes including Row-Diagonal Parity (RDP) codes, EVENODD codes, etc., and the generalizations of the foregoing codes use parities along multiple lines and may have similar applications. Array codes may be used in Redundant Array of Independent Disks (RAID) type architectures (e.g., RAID 6 which requires two parity columns). In some approaches, array codes may be used as an alternative to RS codes which require finite field operations. RS codes are conventionally used to correct a plurality of errors and erasures. Erasures herein may be defined as one or more bits which are unreadable for any reason. RS codes are non-binary cyclic error correction codes which may detect and correct multiple random symbol errors. RS codes using finite field operations are often complex and expensive to process. Array codes may be based on XOR operations and are conventionally less complex than codes based on finite field operations. In various approaches, RDP codes optimize the number of XORs for encoding. In other approaches, EVENODD codes provide independent parities for minimizing the number of updates in the parity when a data symbol is updated.

Definition of Expanded Blaum-Roth (EBR) Codes

Let p be a prime, $R_p$ be the ring of polynomials modulo $1+x^p$, and let $R_p^{(0)} \subset R_p$ be the ideal of polynomials modulo $1+x^p$ of even weight. If $\alpha^p=1$, an expanded Blaum-Roth code, EBR(p, k, r), is the [+r, k] code over $R_p^{(0)}$ whose parity-check matrix is given by (1). EBR codes add a vertical parity to the r parities of slope i for 0≤i≤r−1. The vertical parity may be interpreted as a line of slope infinity. Each line of slope 0, slope 1, and slope 2 in an EBR code has an even parity. The (p−1)×p array becomes a p×p array where p is a prime number. The elements of a BR code may be within the ring of polynomials modulo $M_p(x)$ and $M_p(\alpha)=0$. The elements of an EBR code may be in the ideal $R_p^{(0)}$ and $\alpha^p=1$. Geometrically, the elements of EBR(p, r) codes are p×p arrays such that each column has an even parity and any line of slope j for 0≤j≤r−1 has an even parity.

EBR codes may use only XOR operations which are inexpensive and fast to process. EBR codes may be implemented into software defined storage systems.

EBR codes with r column parties may recover any r erased columns and up to r erased lines of slope j, 0≤j≤r−1 while the column parities are protected by the other parities. EBR codes may recover erasures without having to invoke data from the whole storage system and without reference to other columns. Conventionally, the farther data is pulled from over a network, the more expensive error correction and/or detection is. Locally recoverable properties are desirable for error correction and/or detection schemes.

Definition of Expanded Independent-Parity (EIP) Codes

For k≤p, [k+r, k] codes over the ring of polynomials modulo $M_p(x)$ with independent parity symbols which generalize the EVENODD code, denoted by IP(p, k, r), are defined by the following parity-check matrix $$\tilde{H}_{p,k,r} = \begin{pmatrix} 1 & 1 & 1 & \ldots & 1 & 1 & 0 & 0 & 0 & \ldots & 0 \\ 1 & \alpha & \alpha^2 & \ldots & \alpha^{k-1} & 0 & 1 & 0 & 0 & \ldots & 0 \\ 1 & \alpha^2 & \alpha^4 & \ldots & \alpha^{2(k-1)} & 0 & 0 & 1 & 0 & \ldots & 0 \\ \vdots & \vdots & \vdots & \ddots & \vdots & \vdots & \vdots & \vdots & \ddots & \vdots & \vdots \\ 1 & \alpha^{r-1} & \alpha^{2(r-1)} & \ldots & \alpha^{(r-1)(k-1)} & 0 & 0 & 0 & 0 & \ldots & 1 \end{pmatrix} \quad (2)$$

Let p be a prime, $R_p$ be the ring of polynomials modulo $1+x^p$, and let $R_p^{(0)}$ be the ideal of polynomials modulo $1+x^p$ of even weight. If $\alpha^p=1$, an expanded Independent-Parity (EIP) code, EIP(p, k, r), is the [k+r, k] code over $R_p^{(0)}$ whose parity-check matrix is given by (2). EIP codes add an additional vertical parity to the array.

In one approach, EIP codes may encode (p−1)×k symbols into a p×(k+r) array with r parity columns, where p is a prime number and k≤p and r≥1. Each symbol i in column r+j for 0≤i≤p−1 and 0≤j≤r−1 is the XOR of symbols in a line of slope j taken with toroidal topology modulo p in the k columns starting in symbol i of column 0. Each column in the p×(k+r) array comprises even parity.

In various configurations described herein, even parity comprises, for a given set of bits, the occurrence of bits whose value is 1 is counted. If the occurrence of bits is odd, the parity bit value is set to 1, making the total count of occurrences of is in the whole set an even number. If the count of is is even, the parity bit value is set to 0.

In one approach, a parity row may be appended to the (p−1)×k array of symbols to form a p×k array. In one aspect, encoding the (p−1)×k array symbols into a p×(k+r) array includes computing r syndrome vectors of length p. The symbols of the syndrome vector i, for 0≤i≤r−1, may be XORs of symbols in each p line of slope i in the p×k array. Encoding may comprise appending r parity columns to the p×k array, wherein the r syndrome vectors correspond to the r parity columns, and outputting the p×(k+r) encoded array. The p×(k+r) encoded array may be output in any manner known in the art.

Figure 6:
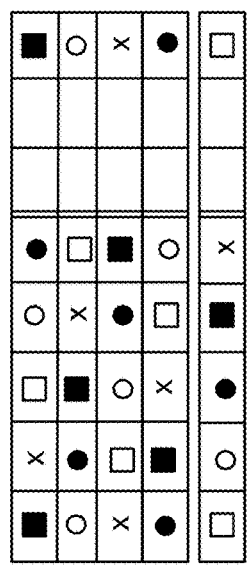
FIG. 6 is an exemplary array comprising parities of slope 0, 1, and 2 in EIP(5, 3) according to one approach.
Figure 6:
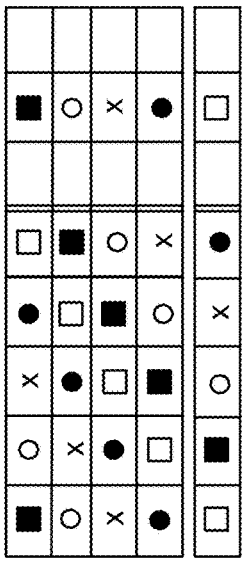

FIG. 6 is an exemplary array comprising parities of slope 0, 1, and 2 in EIP(5, 3) where p=5 and r=3. Each vertical line has even parity. The array comprises 5 logically arranged columns of data and 3 logically arranged columns of parity. The first column of parity stores a horizontal parity. The second parity column stores a diagonal parity of slope 1. The third column of parity stores a diagonal parity of slope 2. Each parity column may be independent from the other parity columns. The independent parity columns may not interact with other parity columns. The independent parity columns may be functions of the data in the data columns.

Figure 7:
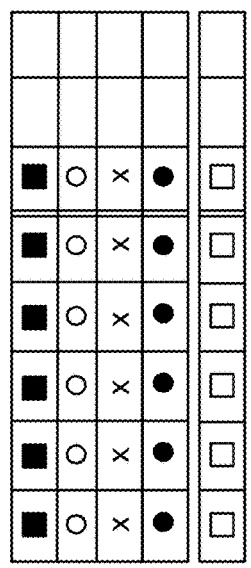
FIG. 7 is an exemplary element in EIP(5, 3), according to one approach.

FIG. 7 is an exemplary element in EIP(5, 3) wherein each column comprises an even number of 1 s. For the first 5 columns of data and the first column of parity (e.g., which is independent from the remaining two parity columns), the 6 columns comprise horizontal parity. The additional parity columns are independent from the first parity column and from each other.

It should be understood by one having ordinary skill in the art that the parameters of the array may be extended to more parameters than those provided in the various examples disclosed herein. For example, the various variables (e.g., f, m, n, p, b, k, r, etc.) may be any suitable value according to any constraints provided (e.g., p is a prime number, etc.). In one approach, the array may comprise any p value provided the r parity columns remain independent of each other.

In various approaches, the EIP(p, k, r) is MDS over $R_p^{(0)}$ if and only if the code IP(p, k, r) is MDS over the polynomials modulo $M_p(x)$. Codes EIP(p, k, r) are MDS for 1≤r≤3. For r>3, the code is MDS in response to the prime number chosen. A list of prime numbers for which EIP(p, k, r) is MDS and r >4 is known in the art for MDS array codes with independent parity symbols.

For any integer l, the unique integer m may be denoted by $<l>_p$ such that 0≤m≤p−1 and m≡l (mod p). Integer $<l>_p$ may be interchangeably denoted by $<l>$ herein.

Encoding EIP(p, k, r)

Consider a (p−1)×k data array $(a_{u,v})$, 0≤u≤p−2 and 0≤v≤k−1, where p is a prime number and 1≤k≤p. For each j, 0≤j≤k−1, compute $$a_{p-1,j} = \bigoplus_{i=0}^{p-2} a_{i,j}. \quad (3)$$

Denote the columns of the encoded p×(k+r) array by $C_j$, for 0≤j≤k+r−1. For 0≤j≤k−1, $C_j$ may be obtained using (3). To obtain $C_{k+v}$ for 0≤v≤r−1, let $$C_{k+v} = \bigoplus_{j=0}^{k-1} \alpha^{vj} C_j \text{ for } 0 \leq v \leq r-1 \quad (4)$$

to complete the encoding. The encoding algorithm optimizes the number of XOR operations. Any known counting algorithm may be used to determine that the number of XORs is kp(r+1)−2k−rp.

EXAMPLE 1

Consider the EIP(5, 5, 3) code comprising 5×8 arrays. FIG. 8 is a 4×5 array to be encoded. The blank spaces indicate locations to be encoded by the encoder.

According to the first step as described above, compute the vertical parities of data by XORing the bits in each column to obtain the array illustrated in FIG. 9. The result of the computing is an even number of 1 s in each column.

According to the second step as described above, the first parity column is computed as the XOR of the first k=5 columns (e.g., columns 0 through 4); the second parity column is the XOR of the first data column with the second data column rotated once, the third data column rotated two times, the fourth data column rotated 3 times and the fifth data column rotated 4 times; and the third parity column is the XOR of the first data column with the second data column rotated twice, the third data column rotated 4 times, the fourth data column rotated 6 times and the fifth data column rotated 8 times as follows:

$$C_5 = \begin{pmatrix}1\\0\\0\\1\\0\end{pmatrix} \oplus \begin{pmatrix}0\\1\\0\\1\\0\end{pmatrix} \oplus \begin{pmatrix}0\\0\\0\\0\\0\end{pmatrix} \oplus \begin{pmatrix}1\\1\\0\\1\\1\end{pmatrix} \oplus \begin{pmatrix}1\\1\\1\\1\\0\end{pmatrix} = \begin{pmatrix}1\\1\\1\\0\\1\end{pmatrix}$$

$$C_6 = \begin{pmatrix}1\\0\\0\\1\\0\end{pmatrix} \oplus \alpha\begin{pmatrix}0\\1\\0\\1\\0\end{pmatrix} \oplus \alpha^2\begin{pmatrix}0\\0\\0\\0\\0\end{pmatrix} \oplus \alpha^3\begin{pmatrix}1\\1\\0\\1\\1\end{pmatrix} \oplus \alpha^4\begin{pmatrix}1\\1\\1\\1\\0\end{pmatrix} = \begin{pmatrix}1\\1\\1\\1\\0\end{pmatrix}$$

$$= \begin{pmatrix}1\\0\\0\\1\\0\end{pmatrix} \oplus \begin{pmatrix}0\\0\\1\\0\\1\end{pmatrix} \oplus \begin{pmatrix}0\\0\\0\\0\\0\end{pmatrix} \oplus \begin{pmatrix}0\\1\\0\\1\\1\end{pmatrix} \oplus \begin{pmatrix}1\\1\\1\\0\\1\end{pmatrix} = \begin{pmatrix}0\\0\\1\\0\\1\end{pmatrix}$$

$$C_7 = \begin{pmatrix}1\\0\\0\\1\\0\end{pmatrix} \oplus \alpha^2\begin{pmatrix}0\\1\\0\\1\\0\end{pmatrix} \oplus \alpha^4\begin{pmatrix}0\\0\\0\\0\\0\end{pmatrix} \oplus \alpha\begin{pmatrix}1\\1\\0\\1\\1\end{pmatrix} \oplus \alpha^3\begin{pmatrix}1\\1\\1\\1\\0\end{pmatrix}$$

$$= \begin{pmatrix}1\\0\\0\\1\\0\end{pmatrix} \oplus \begin{pmatrix}1\\0\\0\\1\\0\end{pmatrix} \oplus \begin{pmatrix}0\\0\\0\\0\\0\end{pmatrix} \oplus \begin{pmatrix}1\\1\\1\\0\\1\end{pmatrix} \oplus \begin{pmatrix}1\\1\\1\\1\\0\end{pmatrix} = \begin{pmatrix}0\\0\\1\\1\\0\end{pmatrix}$$

FIG. 10 is the final encoded array of FIG. 8 using the foregoing method. Where k=p=5 and r=3, 75 total XOR operations are performed. In various approaches, the total number of XOR operations using the foregoing method is less than the total number of XOR operations using conventional techniques.

Lemma 1

The code EIP(p, k, r) is MDS over $R_p^{(0)}$ if and only if the code IP(p, k, r) is MDS over the polynomials modulo $M_p(x)$ as demonstrated below.

Let p be a prime number, r≥1 and consider a p×(k+r) array $$(a_{i,j})_{\substack{0 \leq i \leq p-1 \\ 0 \leq j \leq k+r-1}},$$

where each column is in $R_p^{(0)}$. Consider a (p−1)×(k+r) array $$(\hat{a}_{i,j})_{\substack{0 \leq i \leq p-2 \\ 0 \leq j \leq k+r-1}},$$

defined as $$\hat{a}_{i,j} = a_{i,j} \oplus a_{p-1,j} \text{ for } 0 \leq i \leq p-2 \text{ and } 0 \leq j \leq k-1. \quad (5)$$

The array $$(a_{i,j})_{\substack{0 \leq i \leq p-1 \\ 0 \leq j \leq k+r-1}}$$

is in EIP(p,k, r) if and only if the array $$(\hat{a}_{i,j})_{\substack{0 \leq i \leq p-2 \\ 0 \leq j \leq k+r-1}}$$

is in IP(p, k, r).

EXAMPLE 2

Consider the following 5×8 array in EIP(5, 5, 3)

$$(a_{i,j})_{\substack{0 \leq i \leq 4 \\ 0 \leq j \leq 7}} = \begin{array}{|c|c|c|c|c||c|c|c|} \hline 1 & 0 & 0 & 1 & 1 & 1 & 0 & 0 \\ \hline 0 & 1 & 0 & 1 & 1 & 1 & 0 & 0 \\ \hline 0 & 0 & 0 & 0 & 1 & 1 & 1 & 1 \\ \hline 1 & 1 & 0 & 1 & 1 & 0 & 0 & 1 \\ \hline 0 & 0 & 0 & 1 & 0 & 1 & 1 & 0 \\ \hline \end{array}.$$

A corresponding array in IP(5, 5, 3) as given by the previous lemma is given by $$(\hat{a}_{i,j})_{\substack{0 \leq i \leq 3 \\ 0 \leq j \leq 7}} = \begin{array}{|c|c|c|c|c||c|c|c|} \hline 1 & 0 & 0 & 1 & 1 & 1 & 0 & 0 \\ \hline 0 & 1 & 0 & 1 & 1 & 1 & 0 & 0 \\ \hline 0 & 0 & 0 & 0 & 1 & 1 & 1 & 1 \\ \hline 1 & 1 & 0 & 1 & 1 & 0 & 0 & 1 \\ \hline \end{array}.$$

The columns of $$(\hat{a}_{i,j})_{\substack{0 \leq i \leq 3 \\ 0 \leq j \leq 7}}$$

which have been complemented comprise odd parity. The remaining columns of $$(\hat{a}_{i,j})_{\substack{0 \leq i \leq 3 \\ 0 \leq j \leq 7}}$$

comprise even parity.

Up to r erasures in IP(p, k, r) may be decoded when IP(p, k, r) is MDS as would be understood by one having ordinary skill in the art upon reading the present disclosure. The transform (5) of $$(a_{i,j})_{\substack{0 \leq i \leq p-1 \\ 0 \leq j \leq k+r-1}} \text{ into } (\hat{a}_{i,j})_{\substack{0 \leq i \leq p-2 \\ 0 \leq j \leq k+r-1}}$$

provides a general decoding algorithm for EIP(p, k, r) as described in detail below.

Decoding EIP(p, k, r)

In various approaches, decoding the p×(k+r) array includes recovering up to one erased symbol in each column and recovering up to one erased symbol in each set of k+1 symbols. The set of k+1 symbols may comprise k symbols in a line of slope j, 0≤j≤r−1. In one approach, the recovering starts at symbol i of the first column of the p×(k+r) array and symbol i of the parity column r+j.

In various configurations, recovering up to one erased symbol in each column may refer to recovering an erased symbol in any column with exactly one erased symbol. Similarly, recovering up to one erased symbol in each set of k+1 symbols may refer to recovering an erased symbol in any set of k+1 symbols having exactly one erased symbol.

In another approach for decoding the p×(k+r) array, the decoding includes assuming a code IP(p, k, r) is MDS and p≤r columns are erased. The remaining n+k−p columns each comprise at most one erasure. Each column with exactly one erased symbol may be corrected by obtaining the erased symbol as the XOR of the remaining symbols in the column. Assuming that erased columns are initially set to zero, a new (p−1)×(k+r) array may be constructed by complementing the columns whose last symbol is equal to 1 and eliminating the last row of the obtained array. The decoding may also include correcting the ρ erased columns in IP(p, k, r) by applying the decoding algorithm in IP(p, k, r) to the p×(k+r) array, appending a zero row to the decoded array to obtain a p×(k+r) array and complementing each column of odd weight in the p+(k+r) array. The p×(k+r) array may be output in any manner known in the art.

Consider a p×(k+r) array $$(a_{i,j})_{\substack{0 \leq i \leq p-1 \\ 0 \leq j \leq k+r-1}} \in EIP(p, k, r).$$

Assume that columns $0 \leq j_0 \leq j_1 < \ldots < j_{\rho-2} \leq k+r-1$ are erased where ρ≤r and EIP(p, k, r) is MDS. Assume that $a_{i,j_u}=0$ for $0 \leq u \leq \rho-1$ and obtain $$(\hat{a}_{i,j})_{\substack{0 \leq i \leq p-2 \\ 0 \leq j \leq k+r-1}}$$

according to (5). Decode the erased locations $0 \le j_0 < j_1 < \ldots < j_{\rho-1} \le k+r-1$ of $$(\hat{a}_{i,j})_{\substack{0 \le i \le p-2 \\ 0 \le j \le k+r-1}}$$

in IP(p, k, r). For each $0 \le u \le \rho-1$, obtain $$a_{p-1,j_u} = \bigoplus_{i=0}^{p-2} \hat{a}_{i,j_u}$$

(6)

$$a_{i,j_u} = \hat{a}_{i,j_u} \oplus a_{p-1,j_u} \text{ for } 0 \le i \le p-2.$$

(7)

Output the decoded array $$(a_{i,j})_{\substack{0 \le i \le p-1 \\ 0 \le j \le k+r-1}}.$$

EXAMPLE 3

Consider the 5×8 array in EIP(5, 5, 3) in an MDS code $$(a_{i,j})_{\substack{0 \le i \le 4 \\ 0 \le j \le 7}} = \begin{array}{|c|c|c|c|c||c|c|c|} \hline 1 & 0 & 0 & 1 & 1 & 1 & 0 & 0 \\ \hline 0 & 1 & 0 & 1 & 1 & 1 & 0 & 0 \\ \hline 0 & 0 & 0 & 0 & 1 & 1 & 1 & 1 \\ \hline 1 & 1 & 0 & 1 & 1 & 0 & 0 & 1 \\ \hline 0 & 0 & 0 & 1 & 0 & 1 & 1 & 0 \\ \hline \end{array}.$$

The 3 blank columns (e.g., columns 1, 3, and 6) correspond to erased locations. Perform the transform given by (5) to obtain $$(\hat{a}_{i,j})_{\substack{0 \le i \le 3 \\ 0 \le j \le 7}} = \begin{array}{|c|c|c|c|c||c|c|c|} \hline 1 & 0 & 0 & 1 & 1 & 1 & 0 & 0 \\ \hline 0 & 1 & 0 & 1 & 1 & 1 & 0 & 0 \\ \hline 0 & 0 & 0 & 0 & 1 & 1 & 1 & 1 \\ \hline 1 & 1 & 0 & 1 & 1 & 0 & 0 & 1 \\ \hline \end{array}.$$

Decode the array in IP(5, 3) using techniques known to one having ordinary skill in the art upon reading the present disclosure. Obtain $$(\hat{a}_{i,j})_{\substack{0 \le i \le 3 \\ 0 \le j \le 7}} = \begin{array}{|c|c|c|c|c||c|c|c|} \hline 1 & 0 & 0 & 0 & 1 & 0 & 1 & 0 \\ \hline 0 & 1 & 0 & 0 & 1 & 0 & 1 & 0 \\ \hline 0 & 0 & 0 & 1 & 1 & 0 & 0 & 1 \\ \hline 1 & 1 & 0 & 0 & 1 & 1 & 1 & 1 \\ \hline \end{array}.$$

The corresponding array in EIP(5, 5, 3) as given by (6) and (7) is $$(a_{i,j})_{\substack{0 \le i \le 4 \\ 0 \le j \le 7}} = \begin{array}{|c|c|c|c|c||c|c|c|} \hline 1 & 0 & 0 & 1 & 1 & 1 & 0 & 0 \\ \hline 0 & 1 & 0 & 1 & 1 & 1 & 0 & 0 \\ \hline 0 & 0 & 0 & 0 & 1 & 1 & 1 & 1 \\ \hline 1 & 1 & 0 & 1 & 1 & 0 & 0 & 1 \\ \hline 0 & 0 & 0 & 1 & 0 & 1 & 1 & 0 \\ \hline \end{array}$$

to complete the decoding.

Updating Algorithm for EIP(p, k, r)

Updating the code for EIP(p, k, r) comprises relatively less processing power than conventional updating methods. Conventional methods for updating symbols require flipping most or all symbols and/or recursions in the code. The present updating algorithm uses significantly less operations. Specifically, each time a data symbol $a_{i,j}$, $0 \le i \le p-2$, $0 \le j \le k-1$, is updated in EIP(p, k, r), 2r+1 parity symbols are updated (e.g., the vertical parity symbol $a_{p-1,j}$ and two symbols in each of the r parity columns).

Consider a p×(k+r) array $$(a_{i,j})_{\substack{0 \le i \le p-1 \\ 0 \le j \le k+r-1}} \in EIP(p, k, r).$$

Assume that symbol $a_{u,v}$ is updated by replacing $a_{u,v}$ by $b_{u,v}$, where $0 \le u \le p-2$ and $0 \le v \le k-1$, e.g., $a_{u,v} \leftarrow b_{u,v}$.

Make the following updates:

$$a_{p-1,v} \leftarrow a_{p-1,v} \oplus a_{u,v} \oplus b_{u,v}$$

(8)

$$a_{\langle u+sv \rangle, k+s} \leftarrow a_{\langle u+sv \rangle, k+s} \oplus a_{u,v} \oplus b_{u,v} \text{ for } 0 \le s \le r-1$$

(9)

$$a_{\langle sv-1 \rangle, k+s} \leftarrow a_{\langle sv-1 \rangle, k+s} \oplus a_{u,v} \oplus b_{u,v} \text{ for } 0 \le s \le r-1$$

(10)

EXAMPLE 4

Consider the previous 5×8 array $$(a_{i,j})_{\substack{0 \le i \le 4 \\ 0 \le j \le 7}} = \begin{array}{|c|c|c|c|c||c|c|c|} \hline 1 & 0 & 0 & 1 & 1 & 1 & 0 & 0 \\ \hline 0 & 1 & 0 & 1 & 1 & 1 & 0 & 0 \\ \hline 0 & 0 & 0 & 0 & 1 & 1 & 1 & 1 \\ \hline 1 & 1 & 0 & 1 & 1 & 0 & 0 & 1 \\ \hline 0 & 0 & 0 & 1 & 0 & 1 & 1 & 0 \\ \hline \end{array}.$$

In various approaches, the symbols may be binary. In other approaches, the symbols are non-binary. In another approach, the symbols may be a combination of binary and non-binary. To update $a_{2,3}=0$ with $b_{2,3}=1$, according to (8), (9), and (10) where $a_{2,3} \oplus b_{2,3}=1$, $a_{4,3} \leftarrow a_{4,3} \oplus 1 = 0$
$a_{2,5} \leftarrow a_{2,5} \oplus 1 = 0$
$a_{4,5} \leftarrow a_{4,5} \oplus 1 = 0$
$a_{0,6} \leftarrow a_{0,6} \oplus 1 = 1$
$a_{2,6} \leftarrow a_{2,6} \oplus 1 = 0$
$a_{0,7} \leftarrow a_{0,7} \oplus 1 = 1$
$a_{3,7} \leftarrow a_{3,7} \oplus 1 = 0.$ The updated array is then $$(a_{i,j})_{\substack{0\leq i\leq 4\\0\leq j\leq 7}} = \begin{array}{|c|c|c|c|c|c|c|c|}\hline 1 & 0 & 0 & 1 & 1 & 1 & 1 & 1\\\hline 0 & 1 & 0 & 1 & 1 & 1 & 0 & 0\\\hline 0 & 0 & 0 & 1 & 1 & 0 & 0 & 1\\\hline 1 & 1 & 0 & 1 & 1 & 0 & 0 & 0\\\hline 0 & 0 & 0 & 0 & 0 & 0 & 1 & 0\\\hline\end{array}.$$

Encoding and Decoding the Specific Case of EIP(p, k, 2)

Encoding EIP(p, k, 2) is derived directly from the encoding of EIP(p, k, r) as described in detail above. For the specific case of k≤p−2 of a p×(k+2) array, the [k+2, k] code is MDS over $R_p^{(0)}$. The number of XOR operations for encoding EIP(p, k, 2) when k≤p−2 is 3kp−2(k+p).

In various approaches, encoding EIP(p, k, 2) includes computing the first parity column, wherein the first parity column is the XOR of the k columns and computing the second parity column, wherein the second parity column is the XOR of the first data column with the second data column rotated once, the third data column rotated twice, continuing up to the kth data column rotated k−1 times.

FIG. 11 is a table 1100 comparing the number of XOR operations used for the enhanced encoding algorithm for EBR(p, k, 2) and the encoding algorithm for EIP(p, k, 2). Enhanced encoding for EBR(p, k, 2) comprises 3kp−(k+2) XOR operations. Again, the encoding EIP(p, k, 2) comprises 3kp−2(k+p) XOR operations. As shown, the encoding algorithm for EIP(p, k, 2) is more efficient for the same value of k.

As shown, the encoding algorithm for EIP(p, k, 2) comprises less XOR operations than the enhanced encoding algorithm for EBR(p, k, 2). The reduction in XOR operations is most significant when k≪p.

The following lemma gives a recursion for decoding EIP(p, k, 2).

Lemma 2

Let p be a prime number, $\alpha^p=1$, $\underline{x}(\alpha)=\bigoplus_{i=0}^{p-1} x_i \alpha^i \in R_p^{(0)}$ and 1≤j≤p−1. The recursion $(1 \oplus \alpha^j)\underline{z}(\alpha)=\underline{x}(\alpha)$ has a unique solution in $R_p^{(0)}$. Specifically, if $\underline{z}(\alpha)=\bigoplus_{i=0}^{p-1} z_i \alpha_i$, then $$z_0 = \bigoplus_{u=1}^{\frac{(p-1)}{2}} x_{\langle 2uj\rangle} \tag{11}$$

$$z_{\langle ij\rangle} = z_{\langle (i-1)j\rangle} \oplus x_{\langle ij\rangle} \text{ for } 1 \leq i \leq -1. \tag{12}$$

EXAMPLE 5

Let p=7, $\underline{x}(\alpha)=1 \oplus \alpha^3 \oplus \alpha^4 \oplus \alpha^6$, e.g., $x_0=1$, $x_1=0$, $x_2=0$, $x_3=1$, $x_4=1$, $x_5=0$ and $x_6=1$. Solve the recursion $(1 \oplus \alpha^3)\underline{z}(\alpha)=\underline{x}(\alpha)$. According to (11) and (12), $z_0 = x_2 \oplus x_4 \oplus x_6 = 0$
$z_3 = z_0 \oplus x_3 = 1$
$z_6 = z_3 \oplus x_6 = 0$
$z_2 = z_6 \oplus x_2 = 0$
$z_5 = z_2 \oplus x_5 = 0$
$z_1 = z_5 \oplus x_1 = 0$
$z_4 = z_1 \oplus x_4 = 1$, and
$\underline{z}(\alpha) = \alpha^3 \oplus \alpha^4$.

The recursion comprises $$\frac{3p-5}{2} \text{ XOR}$$

operations.

Decoding EIP(p, k, 2)

In various approaches, decoding a p×(k+2) array includes recovering erasure patterns by iteratively recovering up to one erased symbol in each column and recovering up to one erased symbol in each set of k+1 symbols. The erased columns i and j, for 0≤i<j≤k−1, may be set to zero. Decoding may include computing a syndrome vector $S_0$ as the XOR of the k data columns with the first parity column and a syndrome vector $S_1$ as the XOR of the first data column, the second data column rotated once, the third data column rotated twice, continuing up to the kth data column rotated k−1 times with the second parity column. Decoding may include computing a vector V as the XOR of the syndrome vector $S_0$ with the syndrome vector $S_1$ rotated p−i times, computing an erased column $C_1$ as the solution of a recursion $(1 \oplus \alpha^{j-i})C_j=V$, wherein $(1 \oplus \alpha^{j-i})C_j$ denotes the XOR of vector $C_j$ with vector $C_j$ rotated j−i times and computing an erased column $C_i$ as the XOR of vectors $C_j$ and $S_0$. The decoded p×(k+2) array may be output in any manner known in the art.

In various configurations, recovering up to one erased symbol in each column may refer to recovering an erased symbol in any column with exactly one erased symbol. Similarly, recovering up to one erased symbol in each set of k+1 symbols may refer to recovering an erased symbol in any set of k+1 symbols having exactly one erased symbol.

Consider a p×(k+2) array $(a_{u,v}) \in$ EIP(p, k, 2), 0≤u≤p−1 and 0≤v≤k+1, where p is a prime number and 1≤k≤p.

Assume columns i and j are erased, where 0≤i<j≤k+1. Assume that each of the remaining columns include, at most, one erasure. In one approach, columns with exactly one erasure may be corrected by XORing the remaining p−1 symbols in the column. Every non-erased column comprises even parity. Assume columns i and j are zero.

Denote the columns as $C_v$, where 0≤v≤k+1 and compute the syndromes $$S_0 = \left(\bigoplus_{v=0}^{k-1} C_v\right) \oplus C_k \tag{13}$$

$$S_1 = \left(\bigoplus_{v=0}^{k-1} \alpha^v C_v\right) \oplus C_{k+1} \tag{14}$$

Four distinguished cases are described below:

1) For i=k and j=k+1 (e.g., two parity columns are erased): then, $C_k=S_0$ and $C_{k+1}=S_1$.

2) For i<k and j=k+1 (e.g., a data column and the second parity column are erased): then, $C_i=S_0$ and $C_{k+1}=a^i C_i \oplus S_1$.

3) For j=k (e.g., the first parity column is erased): then, $C_i=a^{-i}S_1$ and $C_k=C_i \oplus S_0$.

4) For j<k (e.g. two data columns are erased), solve the linear system:
$C_i \oplus C_j = S_0$
$a^i C_i \oplus a^j C_j = S_1$.

Solving the system gives $$(1 \oplus a^{j-i})C_j = S_0 \oplus a^{-i}S_1 \tag{15}$$

$$C_i = C_j \oplus S_0. \tag{16}$$

After computing $S_0 \oplus a^{-i}S_1$, $C_j$ in (15) is obtained using the recursion in Lemma 2. After computing $C_j$, $C_i$ is obtained using (16).

EXAMPLE 6

Consider the 5×7 array in EIP(5, 2) where the blank spaces correspond to erasures.

$$(a_{i,j})_{\substack{0 \leq i \leq 4 \\ 0 \leq j \leq 6}} = \begin{array}{|c|c|c|c|c|c|c|} \hline 1 & & 0 & 1 & & 0 & 0 \\ \hline 0 & & & 1 & & 0 & 0 \\ \hline & & 0 & 0 & & 1 & 1 \\ \hline 1 & & 1 & & & 1 & 0 \\ \hline 0 & & 1 & 1 & & & 0 \\ \hline \end{array}.$$

Recover the erasures in the columns having exactly one erasure by XORing the remaining symbols in the column. Each column comprises an even number of 1s. Recovering the erasures in the columns having exactly one erasure by XORing the remaining symbols in the column results in the following array:

$$(a_{i,j})_{\substack{0 \leq i \leq 4 \\ 0 \leq j \leq 6}} = \begin{array}{|c|c|c|c|c|c|c|} \hline 1 & & 0 & 1 & & 0 & 0 \\ \hline 0 & & 0 & 1 & & 0 & 0 \\ \hline 0 & & 0 & 0 & & 1 & 1 \\ \hline 1 & & 1 & 0 & & 0 & 1 \\ \hline 0 & & 1 & 0 & & 1 & 0 \\ \hline \end{array}.$$

Recover columns $i=1$ and $j=4$. Compute the syndromes $$S_0 = \begin{pmatrix} 1 \\ 0 \\ 0 \\ 1 \\ 0 \end{pmatrix} \oplus \begin{pmatrix} 0 \\ 0 \\ 0 \\ 1 \\ 1 \end{pmatrix} \oplus \begin{pmatrix} 1 \\ 1 \\ 0 \\ 0 \\ 0 \end{pmatrix} \oplus \begin{pmatrix} 0 \\ 0 \\ 1 \\ 0 \\ 1 \end{pmatrix} = \begin{pmatrix} 0 \\ 1 \\ 1 \\ 0 \\ 0 \end{pmatrix}$$

$$S_1 = \begin{pmatrix} 1 \\ 0 \\ 0 \\ 1 \\ 0 \end{pmatrix} \oplus \alpha^2 \begin{pmatrix} 0 \\ 0 \\ 0 \\ 1 \\ 1 \end{pmatrix} \oplus \alpha^3 \begin{pmatrix} 1 \\ 1 \\ 0 \\ 0 \\ 0 \end{pmatrix} \oplus \begin{pmatrix} 0 \\ 1 \\ 1 \\ 0 \\ 0 \end{pmatrix} = \begin{pmatrix} 1 \\ 0 \\ 0 \\ 1 \\ 1 \end{pmatrix} \oplus \begin{pmatrix} 0 \\ 0 \\ 0 \\ 1 \\ 0 \end{pmatrix} \oplus \begin{pmatrix} 0 \\ 0 \\ 0 \\ 1 \\ 1 \end{pmatrix} \oplus \begin{pmatrix} 0 \\ 1 \\ 1 \\ 1 \\ 0 \end{pmatrix} = \begin{pmatrix} 0 \\ 1 \\ 1 \\ 1 \\ 1 \end{pmatrix}.$$

According to (15), compute $$S_0 \oplus \alpha^{-1}S_1 = \begin{pmatrix} 0 \\ 1 \\ 1 \\ 0 \\ 0 \end{pmatrix} \oplus \alpha^{-1} \begin{pmatrix} 0 \\ 1 \\ 1 \\ 1 \\ 1 \end{pmatrix} = \begin{pmatrix} 0 \\ 1 \\ 1 \\ 0 \\ 0 \end{pmatrix} \oplus \begin{pmatrix} 1 \\ 1 \\ 1 \\ 1 \\ 1 \end{pmatrix} = \begin{pmatrix} 1 \\ 0 \\ 0 \\ 1 \\ 1 \end{pmatrix}$$

and solve, since $i=1$ and $j=4$, $$(1 \oplus \alpha^3)C_4 = \begin{pmatrix} 1 \\ 0 \\ 0 \\ 1 \\ 0 \end{pmatrix}$$

using (11) and (12). Then $x_0=1$, $x_1=0$, $x_2=0$, $x_3=1$ and $x_4=0$, $\alpha_{0,4} = x_{<6>_5} \oplus x_{<12>_5} = x_1 \oplus x_2 = 0$
$\alpha_{3,4} = \alpha_{0,4} \oplus x_3 = 1$
$\alpha_{1,4} = \alpha_{3,4} \oplus x_1 = 1$
$\alpha_{4,4} = \alpha_{1,4} \oplus x_4 = 1$
$\alpha_{2,4} = \alpha_{4,4} \oplus x_4 = 1$.

Using (16), $$C_1 = C_4 \oplus S_0 = \begin{pmatrix} 0 \\ 1 \\ 1 \\ 1 \\ 1 \end{pmatrix} \oplus \begin{pmatrix} 0 \\ 1 \\ 1 \\ 0 \\ 0 \end{pmatrix} = \begin{pmatrix} 0 \\ 0 \\ 0 \\ 1 \\ 1 \end{pmatrix}.$$

The final decoded array is then $$(a_{i,j})_{\substack{0 \leq i \leq 4 \\ 0 \leq j \leq 6}} = \begin{array}{|c|c|c|c|c|c|c|} \hline 1 & 0 & 0 & 1 & 0 & 0 & 0 \\ \hline 0 & 0 & 0 & 1 & 1 & 0 & 0 \\ \hline 0 & 0 & 0 & 0 & 1 & 1 & 1 \\ \hline 1 & 1 & 1 & 0 & 1 & 0 & 1 \\ \hline 0 & 1 & 1 & 0 & 1 & 1 & 0 \\ \hline \end{array}.$$

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, the computer-implemented method comprising:
   encoding, by the computer, an array of (p−1)×k symbols of data into a p×(k+r) array for expanding independent parity codes and optimizing a number of XOR operations for encoding the data stored in a storage system, the storage system comprising a plurality of storage nodes,
   wherein p is a prime number,
   wherein r≥1,
   wherein k≤p,
   wherein each column in the p×(k+r) array has an even parity, wherein each column is associated with a storage node of the plurality of storage nodes in the storage system,
   wherein symbol i in column r+j, for 0≤i≤p−1 and 0≤j≤r−1, is an XOR of symbols in a line of slope j taken with a toroidal topology modulo p in k data columns starting in symbol i of column 0; and
   outputting, by the computer, the p×(k+r) encoded array to at least some of the plurality of storage nodes, wherein the output p×(k+r) encoded array is configured to enable detection of erased data.

2. The computer-implemented method of claim 1, comprising: appending a parity row to the array of (p−1)×k symbols to form a p×k array.

3. The computer-implemented method of claim 2, comprising computing r syndrome vectors of length p, wherein symbols of the syndrome vector i, for 0≤i≤r−1, are XORs of symbols in each p line of slope i in the p×k array.

4. The computer-implemented method of claim 3, comprising:
   appending r parity columns to the p×k array, wherein the r syndrome vectors correspond to the r parity columns; and
   outputting the p×(k+r) encoded array.

5. The computer-implemented method of claim 4, wherein r=2.

6. The computer-implemented method of claim 5, comprising:
   computing a first parity column, wherein the first parity column is the XOR of the k data columns; and
   computing a second parity column, wherein the second parity column is the XOR of a first data column, a second data column rotated once, a third data column rotated twice, continuing up to a kth data column rotated k−1 times.

7. The computer-implemented method of claim 5, comprising decoding the p×(k+2) array, wherein the decoding comprises:
   recovering erasure patterns by iteratively recovering up to one erased symbol in each column;
   recovering up to one erased symbol in each set of k+1 symbols;
   setting erased columns i and j, for 0≤i<j≤k−1, to zero;
   computing a syndrome vector $S_0$ as the XOR of the k data columns with the first parity column;
   computing a syndrome vector $S_1$ as the XOR of the first data column, the second data column rotated once, the third data column rotated twice, continuing up to the kth data column rotated k−1 times with the second parity column;
   computing a vector V as the XOR of the syndrome vector $S_0$ with the syndrome vector $S_1$ rotated p−i times;
   computing an erased column $C_j$; as the solution of a recursion $1 \oplus \alpha^{j-i})C_j=V$, wherein $1 \oplus \alpha^{j-i})C_j$ denotes the XOR of vector $C_j$ rotated j−i times;
   computing an erased column $C_i$, as the XOR of vectors $C_j$ and $S_0$; and
   outputting the decoded p×(k+2) array.

8. The computer-implemented method of claim 1, comprising decoding the p×(k+r) array, wherein the decoding comprises:
   recovering up to one erased symbol in each column; and
   recovering up to one erased symbol in each set of k+1 symbols,
   wherein the set of k+1 symbols comprises k symbols in a line of slope j, for 0≤j≤r−1,
   wherein the recovering starts at symbol i of the first column of the p×(k+r) array and symbol i of the parity column r+j.

9. The computer-implemented method of claim 8, wherein the decoding comprises:
   recovering erasure patterns by iteratively:
   recovering up to one erased symbol in each column; and
   recovering up to one erased symbol in each set of k+1 symbols.

10. The computer-implemented method of claim 9, wherein r=2.

11. The computer-implemented method of claim 1, comprising decoding the p×(k+r) array, wherein the decoding comprises:
   assuming a code IP(p, k, r) is maximum distance separable (MDS) and p≤r columns are erased, wherein the remaining n+k−p columns each comprise at most one erasure;
   correcting each column with exactly one erased symbol by obtaining the erased symbol as the XOR of the remaining symbols in the column;
   assuming that erased columns are initially set to zero, constructing a new (p−1)×(k+r) array by complementing the columns whose last symbol is equal to 1;
   eliminating the last row of the obtained array;
   correcting the p erased columns in IP(p, k, r) by applying the decoding algorithm in IP(p, k, r) to the p×(k+r) array;
   appending a zero row to the decoded array to obtain a p×(k+r) array;
   complementing each column of odd weight in the p×(k+r) array; and
   outputting the p×(k+r) array.

12. A computer program product for expanding generalized EVENODD codes, the computer program product comprising a computer readable storage medium having program instructions embodied therewith, the program instructions executable by a computer to cause the computer to:
   encode an array, by the computer, of (p−1)×k symbols of data into a p×(k+r) array for expanding independent parity codes and optimizing a number of XOR operations for encoding the data stored in a storage system, the storage system comprising a plurality of storage nodes,
   wherein p is a prime number,
   wherein r ≥1,
   wherein k≤p, wherein each column in the p×(k+r) array has an even parity, wherein each column is associated with a storage node of the plurality of storage nodes in the storage system, wherein symbol i in column r+j, for $0 \le i \le p-1$ and $0 \le j \le r-1$, is an XOR of symbols in a line of slope j taken with a toroidal topology modulo p in k data columns starting in symbol i of column 0; and output, by the computer, the p×(k+r) encoded array to at least some of the plurality of storage nodes, wherein the output p×(k+r) encoded array is configured to enable detection of erased data.

13. The computer program product of claim 12, comprising program instructions to cause the computer to: append, by the computer, a parity row to the array of (p−1)×k symbols to form a p×k array.

14. The computer program product of claim 13, comprising program instructions to cause the computer to:

compute, by the computer, r syndrome vectors of length p, wherein symbols of the syndrome vector i, for $0 \le i \le r-1$, are XORs of symbols in each p line of slope i in the p×k array.

15. The computer program product of claim 14, comprising program instructions to cause the computer to:

append, by the computer, r parity columns to the p×k array, wherein the r syndrome vectors correspond to the r parity columns; and output, by the computer, the p×(k+r) encoded array.

16. The computer program product of claim 15, wherein r=2.

17. The computer program product of claim 16, comprising program instructions to cause the computer to:

compute, by the computer, a first parity column, wherein the first parity column is the XOR of the k data columns; and compute, by the computer, a second parity column, wherein the second parity column is the XOR of a first data column, a second data column rotated once, a third data column rotated twice, continuing up to a kth column rotated k−1 times.

18. The computer program product of claim 16, comprising program instructions to cause the computer to:

decode, by the computer, the p×(k+2) array, wherein the decoding comprises:

recover, by the computer, erasure patterns by iteratively recovering up to one erased symbol in each column;

recover, by the computer, up to one erased symbol in each set of k+1 symbols;

set, by the computer, erased columns i and j, for $0 \le i < j \le k-1$, to zero;

compute, by the computer, a syndrome vector $S_0$ as the XOR of the k data columns with the first parity column;

compute, by the computer, a syndrome vector $S_1$ as the XOR of the first data column, the second data column rotated once, the third data column rotated twice, continuing up to the kth data column rotated k−1 times with the second parity column;

compute, by the computer, a vector V as the XOR of the syndrome vector $S_0$ with the syndrome vector $S_1$ rotated p−i times;

compute, by the computer, an erased column $C_j$ as the solution of a recursion $1 \oplus \alpha^{j-i})C_j = V$, wherein $1 \oplus \alpha^{j-i})C_j$ denotes the XOR of vector $C_j$ with its rotation j−i times;

compute, by the computer, an erased column $C_i$, as the XOR of vectors $C_j$ and $S_0$; and output, by the computer, the decoded p×(k+2) array.

19. The computer program product of claim 12, comprising program instructions to cause the computer to:

decode, by the computer, the p×(k+r) array, wherein the decoding comprises:

recovering, by the computer, up to one erased symbol in each column; and recovering, by the computer, up to one erased symbol in each set of k+1 symbols, wherein the set of k+1 symbols comprises k symbols in a line of slope j, for $0 \le j \le r-1$, wherein the recovering starts at symbol i of the first column of the p×(k+r) array and symbol i of the parity column r+j.

20. The computer program product of claim 18, wherein the decoding comprises program instructions to cause the computer to:

recover, by the computer, erasure patterns by iteratively:

recovering, by the computer, up to one erased symbol in each column; and recovering, by the computer, up to one erased symbol in each set of k+1 symbols.

21. The computer program product of claim 20, wherein r=2.

22. The computer program product of claim 12, comprising program instructions to cause the computer to:

decode, by the computer, the p×(k+r) array, wherein the decoding comprises:

assume, by the computer, a code IP(p, k, r) is maximum distance separable (MDS) and p≤r columns are erased, wherein the remaining n+k−p columns each comprise at most one erasure;

correct, by the computer, each column with exactly one erased symbol by obtaining the erased symbol as the XOR of the remaining symbols in the column;

assume, by the computer, that erased columns are initially set to zero, constructing a new (p−1)×(k+r) array by complementing the columns whose last symbol is equal to 1;

eliminate, by the computer, the last row of the obtained array;

correct, by the computer, the p erased columns in IP(p, k, r) by applying the decoding algorithm in IP(p, k, r) to the p×(k+r) array;

append, by the computer, a zero row to the decoded array to obtain a p×(k+r) array;

complement, by the computer, each column of odd weight in the p×(k+r) array; and output, by the computer, the p×(k+r) array.

23. A system, the system comprising:

a processor; and logic integrated with the processor, executable by the processor, or integrated with and executable by the processor, the logic being configured to:

encode, by the processor, an array of (p−1)×k symbols of data into a p×(k+r) array for expanding independent parity codes and optimizing a number of XOR operations for encoding the data stored in a storage system, the storage system comprising a plurality of storage nodes, wherein p is a prime number, wherein r ≥1, wherein k≤p, wherein each column in the p×(k+r) array has an even parity, wherein each column is associated with a storage node of the plurality of storage nodes in the storage system, wherein symbol i in column r+j, for $0 \leq i \leq p-1$ and $0 \leq j \leq r-1$, is an XOR of symbols in a line of slope j taken with a toroidal topology modulo p in k data columns starting in symbol i of column 0; and output, by the processor, the p×(k+r) encoded array to at least some of the plurality of storage nodes, wherein the output p×(k+r) encoded array is configured to enable detection of erased data.

24. The system of claim 23, comprising logic configured to append a parity row to the array of (p−1) x k symbols to form a p×k array.

25. The system of claim 24, comprising logic configured to compute r syndrome vectors of length p, wherein symbols of the syndrome vector i, for $0 \leq i \leq r-1$, are XORs of symbols in each p line of slope i in the p×k array.

* * * * *